United States Patent [19]

Westmoreland

[11] Patent Number: 5,325,071
[45] Date of Patent: Jun. 28, 1994

[54] OPERATIONAL AMPLIFIER WITH DIGITALLY PROGRAMMABLE GAIN CIRCUITRY ON THE SAME CHIP

[75] Inventor: John C. Westmoreland, Stafford, Tex.

[73] Assignee: Texas Instruments Incorporated, Dallas, Tex.

[21] Appl. No.: 4,827

[22] Filed: Jan. 15, 1993

[51] Int. Cl.[5] .................................. H03G 3/30
[52] U.S. Cl. ......................... 330/282; 330/86
[58] Field of Search ................... 330/86, 282

[56] References Cited

U.S. PATENT DOCUMENTS 4,500,845  2/1985  Ehni ........................... 330/86
5,233,309  8/1993  Spitalny et al. ............. 330/282 X

FOREIGN PATENT DOCUMENTS 58306   5/1981  Japan .......................... 330/282
60810   4/1983  Japan .......................... 330/282
37716   3/1984  Japan .......................... 330/282
96413   4/1990  Japan .......................... 330/282

Primary Examiner—James B. Mullins
Attorney, Agent, or Firm—Wade James Brady; Richard L. Donaldson

[57] ABSTRACT

A single chip operational amplifier wherein the gain is programmable by means of a digitally controlled feedback loop wherein the parameters of the feedback circuit are digitally programmable under control of a microprocessor, microcontroller, control logic and the like. There is provided an operational amplifier with a feedback loop from output terminal to input terminal. The feedback loop contains components which are switched into the feedback loop circuit under control of digital signal provided by an external device, such as, for example, a microprocessor, microcontroller, control logic and the like. The digital signals from the external device cause the appropriate resistors and/or capacitors and/or other components, as may be required, to be switched into the feedback loop of the operational amplifier to provide the desired gain. These digital signals can be derived from a monitoring source which is designed to provide automatic gain control (AGC) or the like.

8 Claims, 1 Drawing Sheet

OPERATIONAL AMPLIFIER WITH DIGITALLY PROGRAMMABLE GAIN CIRCUITRY ON THE SAME CHIP

BACKGROUND OF THE INVENTION

1. Field of the Invention

This invention relates to operational amplifiers and, more specifically, to an operational amplifier having selectively programmable digitally operated gain circuitry on the same chip.

2. Brief Description of the Prior Art

Programmable operational amplifiers in accordance with the prior art have typically been programmed with resistor selection that requires a physical change to the circuitry involved, the resistors being disposed external to the chip containing the amplifier circuitry. In such prior art programmable operational amplifiers, current has been passed through a resistor that must be physically changed in the circuit to change the gain of the amplifier. The major problem with this approach is that the resistors are selected in a non-programmable manner external to the chip containing the operational amplifier. It is desired to provide the same type of function on a single chip.

SUMMARY OF THE INVENTION

In accordance with the present invention, the above described problem of the prior art is eliminated and there is provided an operational amplifier wherein the gain is programmable by means of a digitally controlled feedback loop wherein the parameters of the feedback circuit are digitally programmable under control of a microprocessor, microcontroller, control logic and the like and all components are disposed on a single chip. This provides a saving of space, a reduction in noise and a reduction in cost since both the board size and component count are also reduced.

Briefly, there is provided an operational amplifier with an on-chip component storage which provides the feedback loop from output terminal to input terminal. The feedback loop contains on-chip external components which are switched into the feedback loop circuit under control of digital signals provided by an external device, such as, for example, a microprocessor, microcontroller, control logic and the like. The digital signals from the external device cause the appropriate resistors and/or capacitors and/or other components, as may be required, in the on-chip component storage to be switched into the feedback loop of the operational amplifier to provide the desired gain. These digital signals can be derived from a monitoring source which is designed to provide automatic gain control (AGC) or the like.

DESCRIPTION OF THE PREFERRED EMBODIMENT

Figure 1:
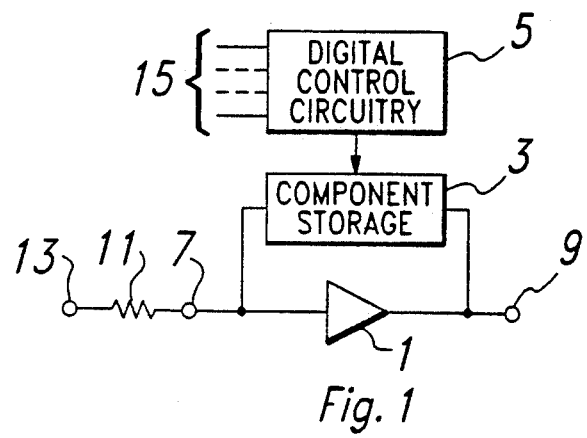
FIG. 1 is a block diagram of an operational amplifier with digitally controlled circuitry in the feedback loop thereof for controlling component parameter content and arrangement in the feedback loop of the amplifier.

Referring to FIG. 1, there is shown a standard operational amplifier 1 having an input terminal 7 and an output terminal 9. The operational amplifier 1 as shown has the input terminal 7 connected to the non-inverting (+) input with the other (−) input grounded. A feedback circuit 3 is connected between the amplifier output terminal 9 and the amplifier input terminal 7, the feedback circuit being a component store under control of the digital control circuitry 5 to provide a selected parameter value composed of resistors and/or capacitors and/or other components to provide a desired gain in the amplifier circuit. A resistor 11 is coupled in series with the circuit input 13 and the amplifier input terminal 7.

The component store 3 is a collection of resistors of various values and/or capacitors of various values and/or other components which are connectable together in one of a plurality of circuit configurations as determined by and under control of the digital control circuitry 5. The components in component store 3 are switched into and out of the circuit.

The digital control circuitry 5 has a plurality of inputs 15 which receive a binary signal from an external digital source, such as a microprocessor, microcomputer, logic, etc.

Figure 2:
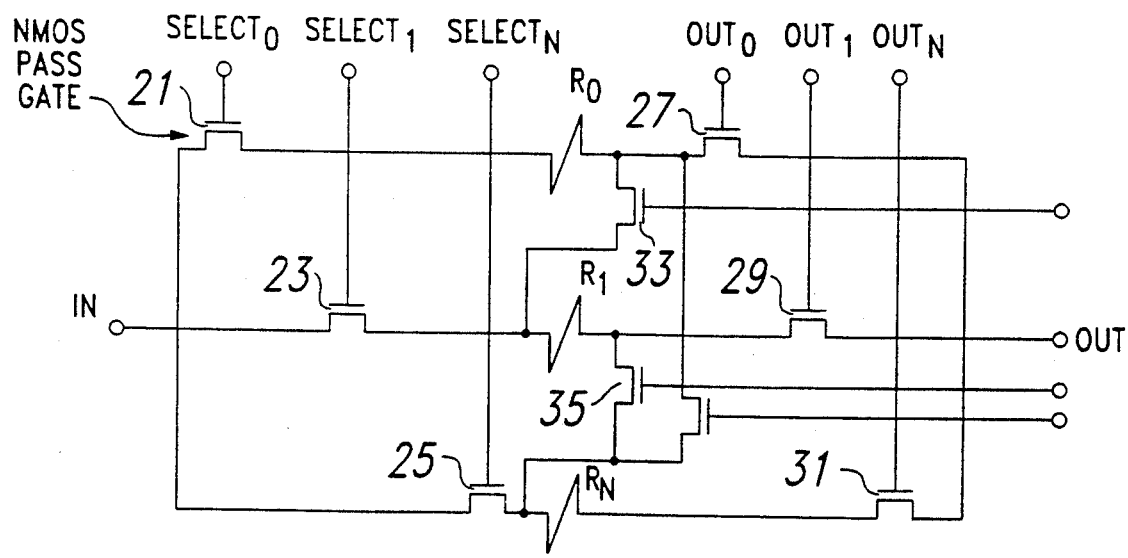
FIG. 2 is a circuit diagram of the digital control circuitry and external components controlled therewith of FIG. 1.

The circuitry of the component store 3 and the digital control circuitry 5 are shown in FIG. 2 wherein resistors $R_o$, $R_1$ and $R_N$ are shown, each of these resistors being coupled to an input which is also the input to amplifier 1 via an associated switch shown as transistors 21, 23 and 25 respectively. Each of the resistors $R_o$, $R_1$ and $R_N$ is coupled to the output which is also the output of amplifier 1 via an associated switch shown as transistors 27, 29 and 31 respectively. Resistors $R_o$ and $R_1$, $R_1$ and $R_2$ or $R_o$, $R_1$ and $R_2$ can be placed in the circuit by appropriate operation of switches 27, 29 and 31 and switches 33 and 35 which connect together the resistors in a series configuration. The resistors $R_o$, $R_1$...$R_N$, though shown as resistors, can also be capacitors or RC combinations.

In operation, for example, to select resistor $R_o$ only, the transistors 21 and 27 are turned on or are in the "1" state by selection of control elements Select$_o$ and Out$_o$ with all other switches being in the "0" state. To select resistor $R_1$ in parallel with resistor $R_o$, transistors 21, 23, 27 and 29 are in the "1" state with all other transistors being in the "0" state. To select resistor $R_o$ in series with resistor $R_1$, transistors 21, 33 and 29 are in the "1" state and all other transistors are in the "0" state. To operate as an automatic gain control (AGC), the processor, controller, etc. continually looks at the output 9 via a voltage sensor to determine which select and control lines to enable to maintain the output voltage at the desired level.

The circuitry as set forth hereinabove is adaptable for placement in its entirety on a single semiconductor chip by use of LinBCMOS that includes both the bipolar and FET input circuitry of the operational amplifier and the CMOS digital control circuitry.

In operation, digital signals will be received at the inputs 15 of the digital control circuitry 5 and select the appropriate components in the component storage 3 which are required to provide the needed gain and connection thereof in a specified circuit arrangement as explained hereinabove.

The system can operate as an automatic gain control by continually updating the digital signals at the input 15 to provide the desired amplifier gain on line as explained hereinabove.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. An amplifier circuit on a single semiconductor chip which comprises:
   (a) a semiconductor chip having thereon each of:
      (i) an amplifier having an input terminal and an output terminal;
      (ii) a digitally operated control circuit; and
      (iii) a feedback circuit disposed between said input terminal and said output terminal, said feedback circuit including a plurality of electrical circuit components, each of said circuit components having an upstream terminus and a downstream terminus, each of said circuit components having associated therewith a separate first series connected switch controlled by said control circuit and coupled to the upstream terminus of said electrical component and a separate second series connected switch controlled by said control circuit and coupled to the downstream terminus of said electrical circuit component, and a plurality of separate switches controlled by said control circuit, each of said separate switches coupled between the downstream terminus of an associated one of said circuit components and the upstream terminus of a different one of the other circuit components to provide interconnection of said circuit components on-line in one of plural serial and parallel arrangements.

2. The circuit of claim 1 wherein said amplifier is an operational amplifier.

3. The circuit of claim 2 further including an electrically resistive element coupled to said input terminal.

4. The circuit of claim 3 wherein said digitally operated control circuit is programmable.

5. The circuit of claim 2 wherein said digitally operated control circuit is programmable.

6. The circuit of claim 1 further including an electrically resistive element coupled to said input terminal.

7. The circuit of claim 6 wherein said digitally operated control circuit is programmable.

8. The circuit of claim 1 wherein said digitally operated control circuit is programmable.

* * * * *